United States Patent [19]

Andrews et al.

[11] Patent Number: 4,583,086
[45] Date of Patent: Apr. 15, 1986

[54] CIRCUIT FOR MONITORING THE OPERATING CONDITION OF AN ELECTRIC LOAD

[75] Inventors: J. Leroy Andrews, Stow; John H. Frey, Madison, both of Ohio

[73] Assignee: Remote Sensors, Inc., Cleveland, Ohio

[21] Appl. No.: 366,554

[22] Filed: Apr. 8, 1982

[51] Int. Cl.[4] ............................................. G08B 21/00
[52] U.S. Cl. .................... 340/640; 340/660; 340/664
[58] Field of Search ............... 340/640, 331, 333, 660, 340/662, 663, 664; 324/119, 127

[56] References Cited

U.S. PATENT DOCUMENTS

| | | | |
|---|---|---|---|
| 3,334,341 | 8/1967 | Green | 340/664 |
| 3,631,392 | 12/1971 | Zelina | 340/331 X |
| 3,658,085 | 4/1972 | Cannella | 137/341 |
| 3,744,046 | 7/1973 | Tamasi | 340/248 R |
| 3,838,339 | 9/1974 | Brandt | 324/133 |
| 3,927,399 | 12/1975 | Fuzzell | 340/248 D |
| 4,031,461 | 6/1977 | Reiner | 324/51 |
| 4,052,664 | 10/1977 | Pohl | 324/51 |
| 4,189,673 | 2/1980 | Shintaku | 324/133 |
| 4,298,869 | 11/1981 | Okuno | 340/815.03 X |
| 4,422,039 | 12/1983 | Davis | 324/127 X |

OTHER PUBLICATIONS

Wen, Y., Voltage Monitor Using a 555, from New Electronics (British), vol. 14, No. 11, Jun. 2, 1981, p. 38.
Edwards, D., LED Flasher Based on Inexpensive IC, from Electronics Australia, vol. 37, No. 4, Jul. '75, pp. 52–53.

Primary Examiner—Jerry W. Myracle
Attorney, Agent, or Firm—Yount & Tarolli

[57] ABSTRACT

A monitor is disclosed for monitoring the operation of an electrically powered load, such as a solenoid or a resistance heater. The load is connected across a power source and normally draws current therefrom. An integrated circuit includes means for energizing a load on indicator so long as the load is drawing current. A power on indicator is energized so long as the monitor receives power from the power source. When the monitor senses that current is no longer being drawn by the load it energizes a flashing on-off fault indicator.

5 Claims, 4 Drawing Figures

CIRCUIT FOR MONITORING THE OPERATING CONDITION OF AN ELECTRIC LOAD

BACKGROUND AND FIELD OF THE INVENTION

The present invention relates to circuits for monitoring the operation of other circuits, and more particularly to a circuit for monitoring the operating conditions of an electric load, such as a solenoic or an electrical heater for heating a stator of an electric motor or for heating a valve.

Nuclear power plants often employ emergency coolant flow valves which stand inoperative for long periods of time. Sometimes valves of this nature include intregral resistance heater coils to prevent the condensation of water in the valve and the subsequent deterioration in the operation of that valve. If the heater coil were to fail, no immediate changes would take place which would permit observation and corrections of the fault condition. Moreover, these circuits generally did not include electronic monitoring circuits for monitoring the operation of the heater coils to verify that they are, in fact, operating properly.

The patent to Tamasi, U.S. Pat. No. 3,744,046 discloses an engine heating system monitor for use on diesel truck tractors and the like which monitors the supply of current to the heater system. Indicator lights indicate whether the heater system is energerized or de-energized, and whether the heater is or is not drawing current.

SUMMARY OF THE INVENTION

The present invention provides a circuit for monitoring the operating conditions of an electric load, where the apparatus includes an integrated circuit timer for processing the outputs provided by a current sensor which is connected in a power line between a power source and the load. The use of the integrated circuit provides a cost effective means of processing the output of the current sensor so as to provide an output indication as to the operating conditions of the load.

More particularly, the apparatus includes an integrated circuit timer means including a timer output terminal and a voltage sensing terminal, where the timer means is operative to provide a first voltage on the timer output terminal when the voltage on the voltage sensing terminal is above a first threshold and to provide a second voltage on the voltage output terminal when the voltage on the voltage sensing terminal is below a second threshold which is lower than the first threshold. The apparatus also includes a current sensor connected in the power line between the power source and the load, where the current sensor has an output connected to the voltage sensing input of the timer means and provides an output voltage which is above the first threshold when current is flowing between the power source and the load and which is below the second threshold when no current is flowing between the power source and the load, whereby the output voltage of the timer means indicates whether the load is drawing current. Finally, an indicator means is connected to the timer output terminal for providing a visual indication as to the output voltage of the integrated circuit timer means.

BRIEF DESCRIPTION OF THE DRAWINGS

The foregoing and other objects and advantages of the present invention will become more readily apparent from the following detailed description, as taken in conjunction with the accompanying drawings, wherein.

DETAILED DESCRIPTION

Figure 1:
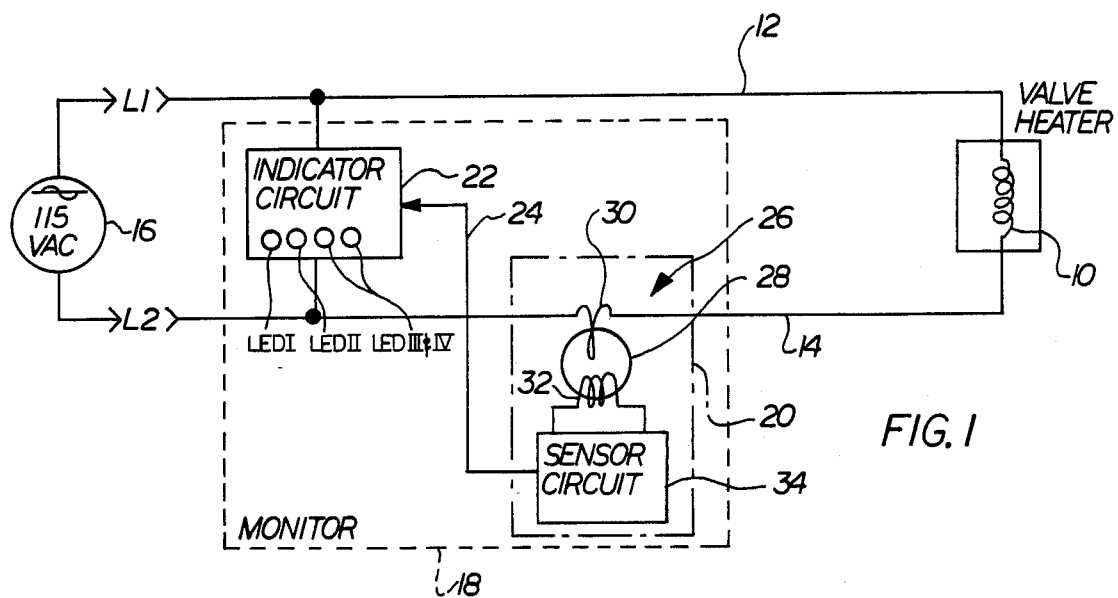
FIG. 1 is an overall block diagram of the monitor circuit and the manner in which it is interconnected with the power means for an electric load.

In FIG. 1 an electric load represented by a valve heater 10 is connected across power mains 12 and 14 which, in turn, receive AC power from an AC power source 16. The power mains 12 and 14 may, for example, comprise the L1 and L2 lines of a commercial power company, whereby the power source 16 provides essentially 115 volts AC. In accordance with the present invention the monitor circuit 18 is interconnected with the power mains so as to monitor the supply of electrical power to the valve heater 10. The monitor circuit 18 includes a current sensor circuit 20 and an indicator circuit 22. The current sensor circuit 20 is connected in the power mains 14 between the power source 16 and the valve heater 10. The current sensor circuit 20 provides an output signal on an output line 24 which has a value indicative of whether current is flowing between the power source 16 and the valve heater 10. The indicator circuit 22 is connected across the power mains 12 and 14 and monitors the power supply signal and the signals from the current sensor 20 to control the states of four indicator lamps incorporated therewith. In FIG. 1 these four indicator lamps are labelled LED I, LED II, LED III and LED IV.

LED I will be illuminated when a power signal is being applied across the power mains 12 and 14, and will otherwise be extinguished. LED II will be illuminated when current is being supplied to the valve heater 10 from the power source 16, but will otherwise be extinguished. LEDs III and IV will be extinguished under normal conditions, but will be flashing on and off when power is applied across the power mains 12 and 14 but no current is being drawn by the valve heater 10. These lamps will be mounted on the outside of the monitor circuit so that the operator can readily view them, and thereby determine the operating condition of the valve heater 10.

Normally, LEDs I and II will be on, indicating that power is appearing across the power mains 12 and 14, and that valve heater 10 is drawing current from the power source 16. If the valve heater 10 develops an open circuit, the supply of current thereto from the power source 16 will stop, whereupon LED II will darken and LEDs III and IV will begin flashing, indicating that the valve heater circuit is not drawing current.

The LEDs also provide a visual indication of the operating condition of the monitor circuit, itself. Faults occurring within the monitor circuit will, in most cases, cause an unusual or failure-indicating pattern of illuminated LEDs. Such failures will not, however, affect the supply of power to the valve heater or other load. This is because the only circuit element connected in series with the valve heater is a high reliability portion of the current sensor (the primary winding of a saturable core reactor in the preferred embodiment). The heater will therefore remain energized even if the monitor circuit fails.

Figure 4:
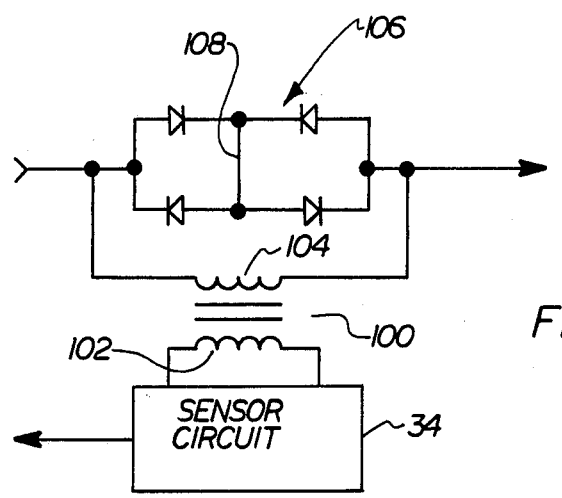
FIG. 4 is a diagramatic representation of an alternative embodiment of a sensor circuit.

The current sensor circuit 20 shown in FIG. 1 is configured so as to provide essentially no interference with the flow of current between the power source 16 and the valve heater 10. More particularly, the current sensor 20 includes a saturable core reactor 26 including an toroidal core 28 having two windings 30 and 32 wound thereabout. The primary winding 30 is connected in the L2 line between the power source 16 and the valve heater 10. The secondary winding 32, however, is connected to a sensor circuit 34 which full-wave rectifies and then filters the signal appearing thereacross so as to provide an output voltage on the output line 24 indicative of the flow of current through the L2 line. Other types of current sensors can be used, however this saturable core reactor is presently preferred since it provides very little interference with the flow of current between the power source 16 and the valve heater 10, it tolerates very high current flows between the source 16 and the heater 10, and because it develops a measurable voltage across its secondary winding for even relatively small current flows between the current source 16 and valve heater 10. An additional type of current sensor is shown in FIG. 4 and will be described hereinafter with reference to that Figure.

Figure 2:
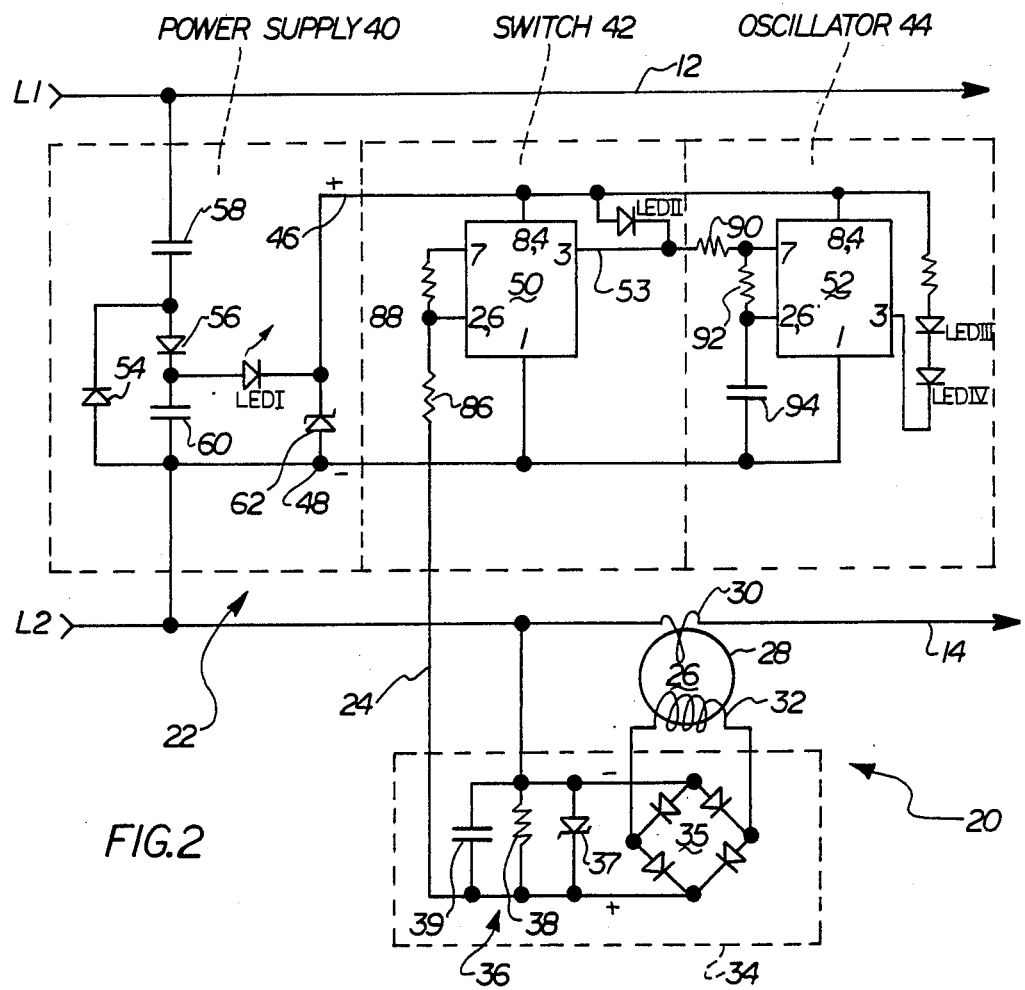
FIG. 2 is a more detailed schematic circuit of a preferred embodiment of a monitor circuit in accordance with the teachings of the present invention.

The circuit details of the sensor circuit 34 are shown in FIG. 2. In this Figure the sensor circuit 34 is shown as including a full wave rectifier 35 whose AC input terminals are connected to the two ends of the secondary winding 32, and whose positive and negative D.C. outputs are connected to a filtering and regulation circuit 36. The filtering and regulation circuit 36 includes a zener diode 37, a resistor 38, and a capacitor 39. These three elements are connected in parallel with one another across the positive and negative DC outputs of the full wave rectifier 35.

When current is passing through the power main 14 to the heater coil 10, an AC voltage appears across the secondary winding 32 of the transformer 26. The AC voltage is rectified by the full wave rectifier 35, and filtered by the filtering and regulation circuit 36. The zener diode 37 prevents the DC voltage from exceeding a predetermined voltage, set by the zener voltage of the diode, whereas the capacitor 39 filters out the AC component of the full wave rectified signal. As long as current continues to flow through the power main 14, a DC voltage will be developed across the capacitor 39 and thus on the output line 24. If an open circuit condition develops within the heater coil 10, however, no further current will be pumped into the capacitor 39 through the full wave rectifier 35. The capacitor 39 will then discharge through the resistor 38, whereby the output voltage on the output line 24 will decay with time.

FIG. 2 is a more detailed circuit schematic of the monitor circuit 18. The indicator circuit 22 shown in FIG. 2 includes three subsections: a power supply section 40; a switch section 42; and an oscillator section 44.

The power supply 40 is connected across the L1 and L2 lines, and is included to provide a DC supply voltage across power supply rails 46 and 48 for use by the switch circuit 42 and oscillator circuit 44. The power supply section 40 also includes LED I, which is energized whenever power is applied across the L1 and L2 lines. Switch circuit 42 has an input connected to the output line 24 of the current sensor 20, and includes an integrated circuit timer 50. The integrated circuit timer 50 has a timer output terminal 53 which is interconnected with LED II and with the oscillator 44 such that either LED II or the oscillator is energized at any given time. In operation, LED II is energized when current is flowing through the valve heater coil 10, whereas the oscillator 44 is energized when no current is flowing through the valve heater 10.

The oscillator circuit 44 is connected to the timer output terminal 53 of the switch 42, and includes a second integrated circuit timer 52 having LED III and LED IV connected to the output terminal thereof. When energized by the signal appearing on the timer output terminal 53 of integrated circuit timer 50, integrated circuit timer 52 oscillates between output states; one wherein the LEDs are energized, and one wherein they are not energized. The LEDs therefore flash on and off.

The power supply 40 shown in FIG. 2 is essentially a current pump, which utilizes two diodes 54 and 56 for routing positive and negative current flow in two different directions. The diode 54 has its anode connected to the negative power supply rail 48 and its cathode connected to the anode of diode 56. The anode of diode 56 is also connected to the power main 12 through a capacitor 58. The cathode of diode 56 is connected to the other power main 14 through a second capacitor 60.

When the voltage of the power signal appearing on power main L1 is negative with respect to L2, current is drawn through the diode 54 so as to charge the capacitor 58 as the magnitude of the power signal continues to drop more and more negative. As the power supply signal reaches its negative peak and begins to return in a positive direction, the diode 54 becomes reverse biased, and current is pumped through the capacitor and diode 56 to the capacitor 60. The capacitor 60 thus charges up to some positive DC voltage. This continues cyclically, with capacitor 58 charging during negative half-cycles of the power signal and capacitor 60 charging during positive half-cycles.

The voltage across capacitor 60 is regulated by a zener diode 62 which has its anode connected to the negative power supply rail 48 and its cathode connected to the cathode of LED I. The anode of LED I is connected to the cathode of diode 56, whereby a path for positive current flow exists from the capacitor 60 to the zener diode 62. When the voltage across the capacitor 60 exceeds the zener voltage (which it will do during normal operation of the power supply) the zener diode 62 becomes conductive and clamps the voltage thereacross at the zener voltage. This causes current to flow through LED I, which thereby becomes illuminated. The positive supply rail 46 is connected to the cathode of the zener diode 62, whereby the voltage appearing across the zener diode represents the DC supply voltage which is provided to the remaining two circuit sections 42 and 44.

Figure 3:
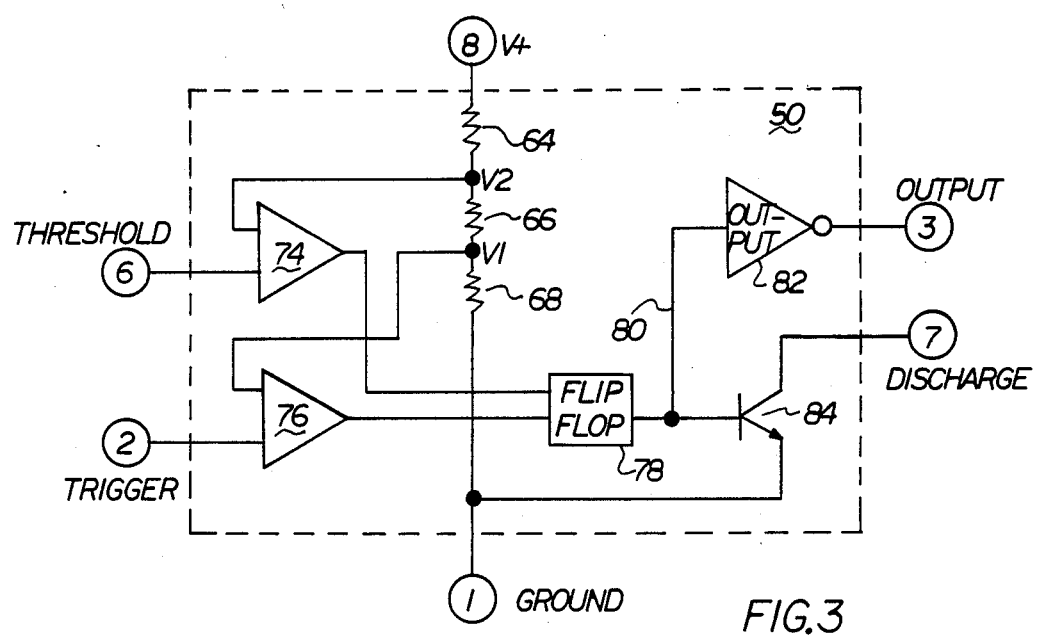
FIG. 3 is a more detailed schematic circuit of the contents of the integrated circuit timers incorporated in the circuitry of FIG. 2.

As indicated previously, the switch section 42 of indicator circuit 22 includes an integrated circuit timer 50. This integrated circuit timer may be the Signetics NE555 or its equivalent, of which there are many. The integrated circuit timer 50 has two power supply terminals corresponding to pins 1 and 8 of the standard eight pin dual-in-line (DIP) package. This can more readily be seen in FIG. 3, which is detailed illustration of the contents of the integrated circuit timer blocks 50 and 52 of FIG. 2. Integrated circuit timer 50 includes three equal valued resistors 64, 66, and 68 which are connected in series between ground and a V+ voltage supply. These three resistors act as a voltage divider, and provide two reference voltages corresponding to one third of the supply voltage (at terminal V1 between resistors 66 and 68) and two thirds (at terminal V2 between resistors 64 and 66) of the supply voltage. The comparator circuit 74 compares an input signal appearing on pin 6 of the DIP with the reference signal V2, and provides an output signal having one of two values dependent upon the relative magnitudes of these two signals. The comparator circuit 76, on the other hand, compares a different input signal appearing on pin 2 of the DIP with the reference voltage V1, and provides an output signal having one of two levels dependent upon the relative magnitudes of these two signals. Pins 2 and 6 of the integrated circuit timer 50 are conventionally connected together such that the comparator circuits 74 and 76 compare the same input signal against two reference levels V1 and V2.

The outputs of the comparator circuits 74 and 76 are connected to a bistable flip-flop 78 and control the logic state thereof. When the input signal exceeds the V2 reference level, comparator 74 changes to a state which resets the flip-flop 78. When thus reset, the output line 80 is connected to an output circuit 82 which buffers and inverts the signal appearing thereon so as to provide an output signal which is applied to the output terminal 3 of the integrated circuit timer. Also connected to the output line 80 of the flip-flop 78 is a transistor 84 whose collector-emitter current path is connected between pin 7 of the integrated circuit and the ground terminal, i.e., pin 1. The base of the transistor 84 is connected to the output of the flip-flop 78 such that the transistor 84 is turned on whenever the output of flip-flop 78 is at a high logic level.

When the comparator 74 sets flip-flop 78 in response to the input signal rising above the reference voltage V2, the output of flip-flop 78 goes to a high logic level. This turns on the discharge transistor 84 and causes the output signal on pin 3 to drop to a low logic level, corresponding to the potential applied to the ground terminal 1 of the integrated circuit package. When the input signal applied to pin 2 thereafter drops below reference voltage V1 (i.e., one third of the supply voltage) the comparator 76 resets the flip-flop 78, causing its output signal to drop to a low voltage level. This turns off transistor 84 and causes the output provided by output circuit 82 to rise to a high logic level.

In switch circuit 42, pins 2 and 6 of the comparators 74 and 76 are connected together and are connected to the output line 24 of the current sensing circuit 20 through a resistor 86. An additional resistor 88 is connected between the pins 2 and 6 of the integrated circuit and a discharge pin 7. The magnitude of the voltage signal appearing at the timer output terminal 53 (pin 3 of the integrated circuit) is dependent upon the magnitude of the signal appearing on the output line 24 of the current sensor 20. When this voltage signal is above the reference signal V2 (FIG. 3), as it will be when current is flowing to the heater coil, the potential appearing upon the timer output terminal 53 is at a low logic level. Pin 3 may then be considered to be effectively connected to a negative power supply rail 48. LED II is connected between the timer output terminal 53 and the positive power supply rail 46. LED II is therefore illuminated when the output signal is at a low logic level, since it then has a positive voltage across it. LED II includes an internal resistor for limiting current flow therethrough.

In the event that the current flow through the heater coil stops, however, the signal appearing on the output terminal 24 of the current sensor 20 will drop, assisted in part by the discharging of the current through resistor 88, pin 7, and the discharge transistor 84 of the integrated circuit 50. The voltage signal appearing on output line 24 of current sensor 20 will therefore soon drop below the reference voltage V1 (FIG. 3), whereupon the output signal provided by the output terminal 53 will rise to a high logic level. The output terminal 53 may then be considered to be effectively connected to the positive power supply rail 46. In this event, LED II is de-energized, since the voltage drop across the diode is then essentially zero.

The oscillator 44 includes a second integrated circuit timer 52 whose discharge terminal (pin 7) is connected to the timer output terminal 53 of integrated circuit timer 50 through a resistor 90. The discharge terminal is also connected to the comparator input terminals 2 and 6 through a second resistor 92. The comparator input terminals are also connected to ground through a timing capacitor 94.

As long as the output signal provided along timer output terminal 53 is at a low logic level (i.e., as long as current is being drawn by the valve heater) the capacitor 94 is discharged, whereby the signal appearing at the comparator input terminals of integrated circuit 52 is below the threshold voltage V1. The output signal provided on the timer output terminal (pin 3) of integrated circuit timer 52 is then at a high voltage level, corresponding approximately to the potential appearing on the positive power supply rail 46. LEDs III and IV are connected in series between the positive supply rail 46 and pin 3 of integrated circuit timer 52, and will be darkened at this time since there is then no voltage being applied across them.

When the output signal provided on timer output terminal 53 of integrated circuit timer 50 rises to a high logic level (as, for example, it will when an open circuit condition occurs in the heater coil), the capacitor 94 will begin to charge through resistors 90 and 92. When the voltage across the capacitor 94 reaches the threshold voltage V2, the output of the flip-flop 78 (FIG. 3) internal to the integrated circuit timer will change state, causing the discharge terminal 7 to be grounded and the output pin 3 to drop to a low logic level. The capacitor 94 will then discharge through resistor 92 until such time as the comparator input voltage on pins 2 and 6 drops below the reference voltage V1, at which time the flip-flop will again change state. The capacitor 94 will thereafter periodically charge and discharge, and the output signal applied on the output pin 3 of integrated circuit timer 52 will change states in the same rhythmic manner.

Each time the voltage level on the output pin 3 of integrated circuit timer 52 is at a low logic level, LEDs III and IV will be illuminated. Each time the voltage at the output of pin 3 of integrated circuit timer 52 is at a high logic level, however, LEDs III and IV will be darkened. Consequently, as the output state of integrated circuit timer 52 oscillates, the LEDs will flash on and off, thereby alerting the operator that the heater coil is not drawing current.

FIG. 4 illustrates a second circuit for sensing current flow through the heater coil. In FIG. 4 the saturable coil reactor 26 is replaced by a more conventional transformer 100 having its secondary windings 102 connected to the sensor circuit 34 as in previous embodiments. The primary winding 104, however, is connected across a full wave rectifier 106 having its DC output terminals shorted across by a conductor 108 such that the full wave rectifier functions as a series combination of two anti-parallel diode combinations.

Although the invention has been described with respect to a preferred embodiment, it will be appreciated that various rearrangements and alterations of parts may be made without departing from the spirit and scope of the present invention, as defined in the appended claims.

What is claimed is:

1. Apparatus for monitoring the operating condition of a valve heater connected across a power source by power lines so as to normally draw current, comprising:
   first integrated circuit timer means including a timer output terminal and a voltage sensing terminal, said timer means being operative to provide a first signal on its timer output terminal when the voltage on said voltage sensing terminal is above a first threshold and to provide a second signal on its timer output terminal when the voltage on said voltage sensing terminal is below a second threshold, lower than said first threshold;
   a current sensor connected in said power line between said power source and said valve heater, said current sensor having an output connected to said voltage sensing terminal of said first timer means and providing an output voltage which is above said first threshold when current is flowing between said power source and said valve heater and which is below said second threshold when no current is flowing between said power source and said valve heater, whereby the output signal of said first timer means indicates whether said valve heater is drawing current;
   first indicator means connected to said timer output terminal of said first timer means, said indicator means including a lamp which becomes illuminated when said timer is providing said first signal, and which is not illuminated otherwise, thereby providing a visual indication when current is flowing to said valve heater;
   second integrated circuit timer means including a timer output terminal and a voltage sensing terminal, said voltage sensing terminal being connected to said timer output terminal of said first integrated circuit timer means, said second timer means providing a third signal on its timer output terminal when said first timer means is providing said first signal and providing a fourth signal on its timer output terminal when said first timer means is providing said second signal; and
   second indicator means connected to said timer output terminal of said second timer means, said second indicator means including a lamp which periodically illuminates in response to said fourth signal and is not illuminated otherwise, said second indicator means thereby providing a flashing visual indication whenever no current is flowing between said source and said valve heater.

2. Apparatus as set forth in claim 1 including D.C. power supply circuit means interposed between said power source and said valve heater for supplying a D.C. voltage so long as power is supplied to said apparatus by said power source.

3. Apparatus as set forth in claim 2 including power on indicator means for providing a visual power on indication so long as power is supplied to said apparatus.

4. Apparatus as set forth in claim 1, wherein said current sensor comprises a transformer having primary and secondary windings, said primary winding being coupled in series between said power source and said valve heater, and said secondary connected to rectifier means having an output connected to said voltage sensing terminal of said first timer means.

5. Apparatus as set forth in claim 4, wherein said rectifier means includes first means for rectifying the AC signal appearing across said secondary winding when alternating current is flowing to said valve heater and second means for filtering the resulting rectified signal to thus provide a continuous DC signal to said voltage sensing terminal of said first timer means as long as AC current is flowing to said valve heater.

* * * * *